United States Patent [19]
Chung

[11] Patent Number: 5,442,209
[45] Date of Patent: Aug. 15, 1995

[54] SYNAPSE MOS TRANSISTOR

[75] Inventor: Ho-sun Chung, Taegu, Rep. of Korea

[73] Assignee: Gold Star Electron Co., Ltd., Cheongju-city, Rep. of Korea

[21] Appl. No.: 253,215

[22] Filed: Jun. 2, 1994

Related U.S. Application Data

[63] Continuation of Ser. No. 68,163, May 28, 1993, abandoned.

[30] Foreign Application Priority Data

May 30, 1992 [KR] Rep. of Korea .................. 92-9479

[51] Int. Cl.$^6$ .................. H01L 29/80; H01L 29/78
[52] U.S. Cl. .................. 257/270; 257/365; 257/393; 257/401; 395/21
[58] Field of Search .................. 257/331, 401, 4, 5, 257/443, 365, 270, 393; 307/201

[56] References Cited

U.S. PATENT DOCUMENTS

| | | | |
|---|---|---|---|
| 3,652,906 | 3/1972 | Christensen | 257/365 |
| 4,717,944 | 1/1988 | Van de Wiel et al. | 257/365 |
| 4,969,021 | 11/1990 | Thakoor et al. | 257/315 |
| 5,010,512 | 4/1991 | Hartstein et al. | 307/201 |

FOREIGN PATENT DOCUMENTS

| | | | |
|---|---|---|---|
| 56-150858 | 11/1981 | Japan | 257/365 |
| 60-257150 | 12/1985 | Japan | 257/401 |
| 62-35559 | 2/1987 | Japan | 257/365 |
| 36679 | 1/1991 | Japan | 257/365 |
| 03006679 | 1/1991 | Japan | 257/365 |
| 3297170 | 12/1991 | Japan | 257/365 |

OTHER PUBLICATIONS

Electronics Magazine Jul. 5, 1963, p. 46, Micropower Goes International.

The Electronic Engineer Sep. 1967, p. 36, Understanding and Using the Dual-gate MOSFET, R. Dawson et al.

Primary Examiner—Rolf Hille
Assistant Examiner—T. M. Arroyo
Attorney, Agent, or Firm—Rothwell, Figg, Ernst & Kurz

[57] ABSTRACT

A synapse MOS transistor has gate electrodes of different lengths, different widths or different lengths and widths, between one source region and one drain region. Thus, when using the synapse MOS transistor to implement a neural network, the chip area can be greatly reduced.

8 Claims, 5 Drawing Sheets

SYNAPSE MOS TRANSISTOR

This is a continuation of application Ser. No. 08/068,163, filed May 28, 1993, abandoned.

BACKGROUND OF THE DISCLOSURE

The present invention relates to a synapse MOS transistor, and particularly to a synapse MOS transistor which is useful in neural networks.

A conventional MOS transistor is constructed to have one drain electrode, one source electrode and one gate electrode so that the transistor is supposed to be driven by receiving a single input. Even if the transistor has multiple gates to receive a plurality of inputs, their aspect ratios are the same.

SUMMARY OF THE INVENTION

Therefore, it is an object of the present invention to provide a synapse MOS transistor in which multiple gates formed on one transistor are different in terms of aspect ratio.

It is another object of the present invention to provide a synapse MOS transistor which can be practically employed in a neural network.

To accomplish the above objects of the present invention, there is provided synapse MOS transistors which have a plurality of gate electrodes of different lengths, a plurality of gate electrodes of different widths or a plurality of gate electrodes of different lengths and widths, respectively, on one source region and one drain region.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE INVENTION

Prior to the description of the synapse MOS transistor of the present invention with reference to the attached drawings, the background of the present invention will be described below.

In realizing a VLSI neural network, there are several problems to solve, such as the accomplishment of a synapse, the reduction of the number of connections between neurons, the multiplication of weights, and the summing of the weights at each node. Therefore, in view of difficulties in real-time processing and chip manufacturing, a CMOS device has been selected to perform the functions of multiplication and summing.

In the neural network, the cell body of a neuron is composed of two CMOS inverters or a differential amplifier. The weight of each synapse is obtained by using P-channel and N-channel MOSFETs having a conductance G. The synapse is constructed so that the PMOS functions as an excitatory element, the NMOS functions as an inhibitory element, and the conductance G is determined by their aspect ratios (W/L, where W is the width of the channel and L is its length).

If the synapse is inhibitory, the applied potential should drop to a low voltage when transferred to a next neuron. If the synapse is excitatory, the applied potential should be raised up to the power supply voltage. The currents passing through the synapse weights are summed in the form of a wired-OR configuration.

The two CMOS inverters exhibit the characteristics of a hard limit activation function. When the aspect ratios of the PMOS and NMOS are varied, an intended connection weight can be aligned to the synapse because the conductance G of the MOS transistor is determined by width W and length L of the channel.

Figure 1:
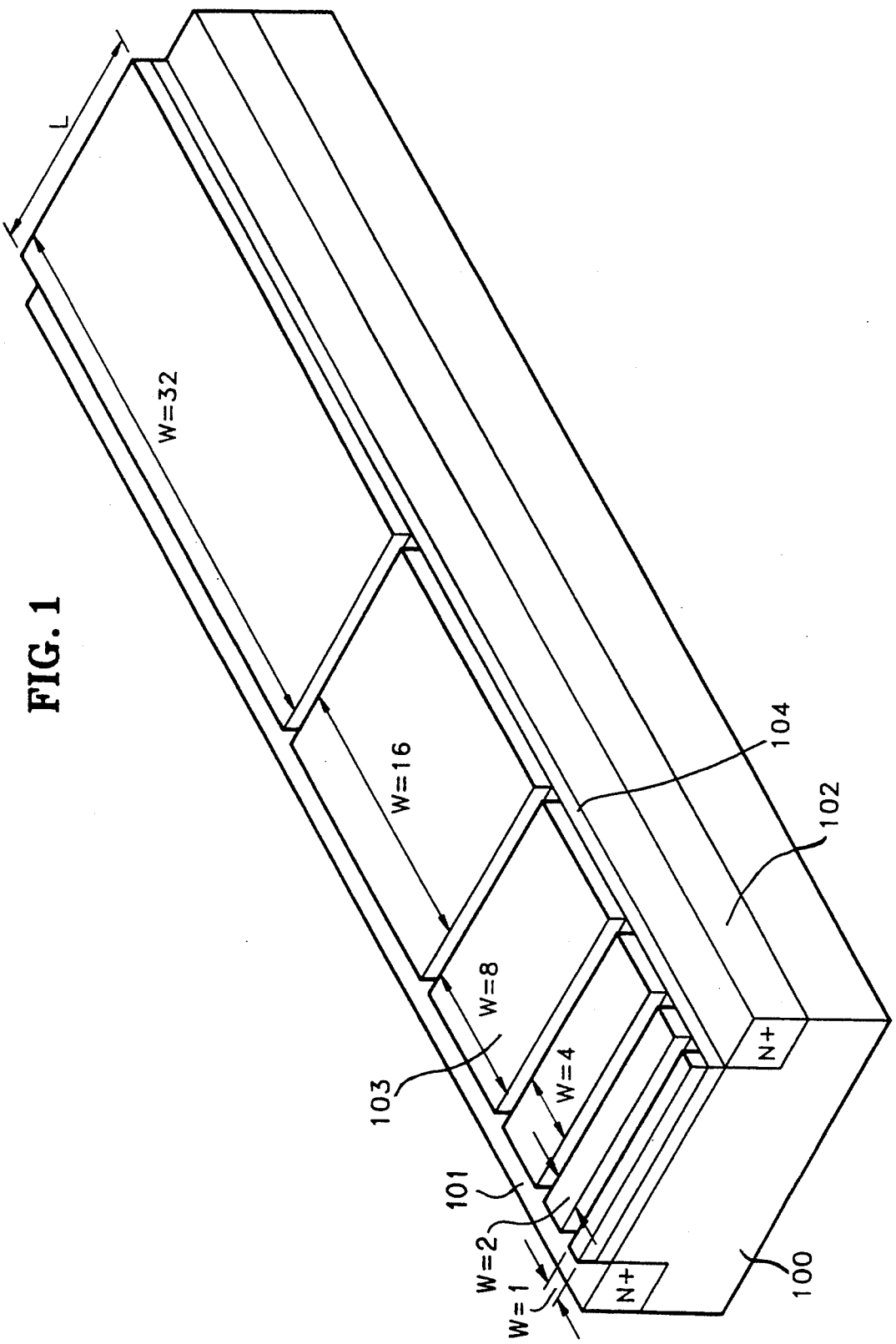
FIG. 1 illustrates one embodiment of a synapse MOS transistor of the present invention.

Referring to FIG. 1, an n+ well is formed in a p-type substrate 100 to form a source region 101 and a drain region 102. Then, an oxide ($SiO_2$) layer 104 is coated on the p-type substrate. Six gate electrodes 103 in which each length L (from the source electrode to the drain region) is the same and the widths W are 1, 2, 4, 8, 16 and 32 units, respectively, are formed on the oxide layer. This is an NMOS structure (hereinafter to be referred to as a "synapse NMOS transistor"). The current of each gate increases as its width increases. The channels formed by the six gates each have a different conductance and the sum of the six conductances becomes one conductance G of the synapse NMOS transistor.

Figure 2:
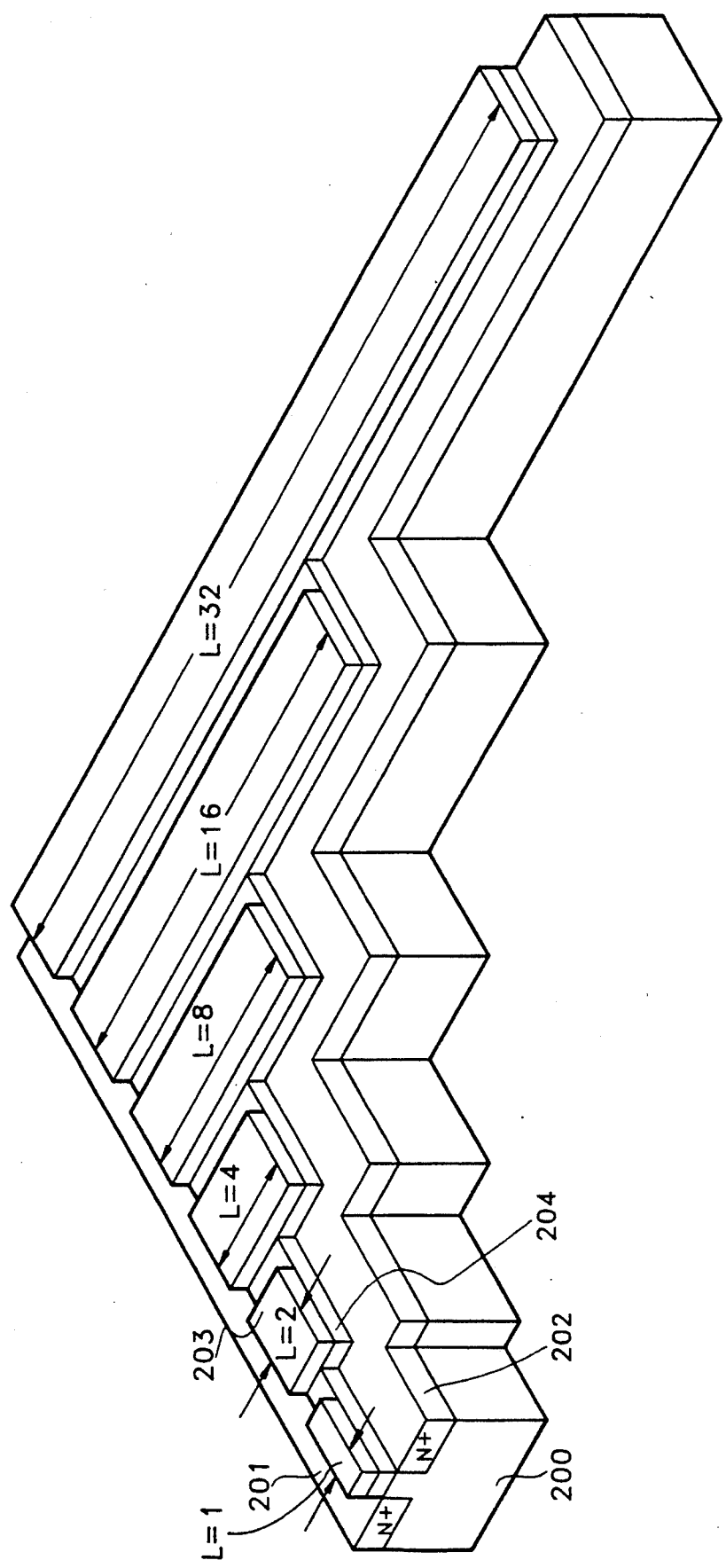
FIG. 2 illustrates another embodiment of a synapse MOS transistor of the present invention.

Referring to FIG. 2, an n+ well is formed in a p-type substrate 200 to form a source region 201 and a drain region 202. Then, an oxide ($SiO_2$) layer 204 is coated on the p-type substrate. Six gate electrodes 203 whose widths (W) are equal and whose lengths L (from the source region to the drain region) are 1, 2, 4, 8, 16 and 32 units, respectively, are formed on the oxide layer. In this structure, the drain region 202 is formed in a staircase shape as shown in FIG. 2. As the case may be, the source region 201 can be alternatively formed in a staircase shape. This structure is also a synapse NMOS transistor. As in FIG. 1, the channels formed by the six gates each have a different conductance and the sum of the six conductances becomes one conductance G of the MOS transistor.

A synapse PMOS transistor is made in a reverse manner, wherein a p+ well is constructed to form a source region and a drain region, with the gate electrodes being formed as above.

Now, using the synapse NMOS transistors shown in FIG. 2 and the synapse PMOS transistor (not shown), the method for implementing a neural comparator will be described below.

Figure 3:
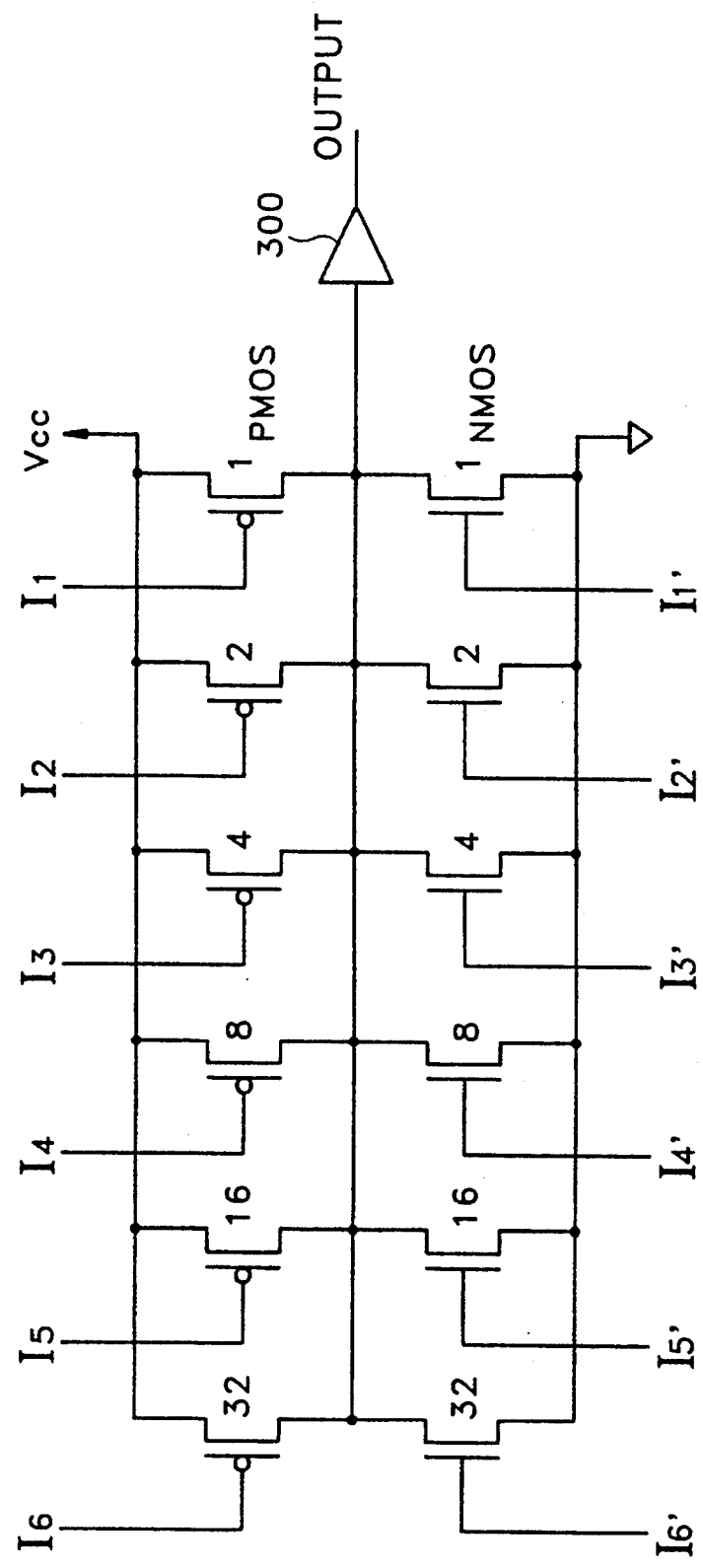
FIG. 3 illustrates a conventional 6-bit neural comparator.

FIG. 3 illustrates a conventional 6-bit neural comparator for comparing six first inputs $I_1$-$I_6$ and six second inputs $I_1'$-$I_6'$. The neural comparator is constructed to use six NMOS and six PMOS transistors which have 1, 2, 4, 8, 16 and 32 channel lengths, wherein each of six PMOS transistors has a source electrode connected to the power supply voltage, a drain electrode connected to a neuron 300, and a gate electrode connected to the first inputs, respectively, and each of six NMOS transistors has a source electrode connected to ground, a drain electrode connected to neuron 300, and a gate electrode connected to the second inputs.

Desired weight can be transmitted to the synapse transistors when the aspect ratios of PMOS and NMOS transistors are different from each other, because the conductances of MOS transistors are determined by the channel widths and lengths.

In the circuit of FIG. 3, the PMOS transistors conduct when the signal applied to their respective gate electrodes is 0, and the NMOS transistors conduct when the applied signal is 1. Then, when the 6-bit signal input to the PMOS transistors is logically greater than that input to the NMOS transistors, a logic value "1" is output, and when the former is logically smaller than the latter, a logic value "0" is output. Here, the sum of the conductances of the PMOS and NMOS transistors turned on according to the inputs determines the output value.

Figure 4:
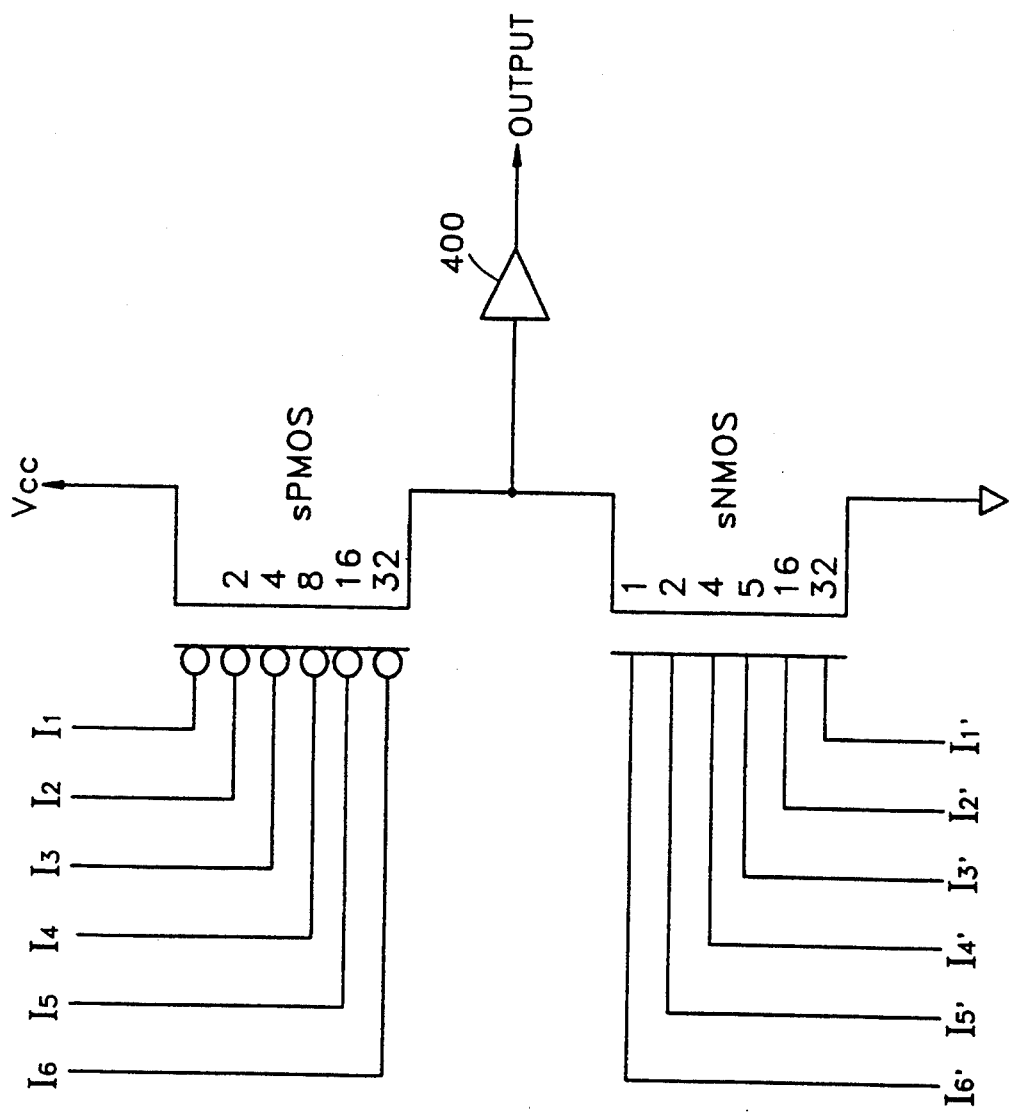
FIG. 4 illustrates a 6-bit neural comparator using a synapse MOS transistor of the present invention.

Referring to FIG. 4 showing the neural comparator using the synapse MOS transistor of the present invention, the comparator is constructed to comprise a synapse PMOS transistor (sPMOS) having a source electrode, which receives power voltage, a drain electrode, and six gate electrodes for receiving six first inputs $I_1$–$I_6$, and a synapse NMOS transistor (sNMOS) having a source electrode connected to ground and a drain electrode connected to the drain electrode of the sPMOS transistor, and six gate electrodes for receiving six second inputs $I_1'$–$I_6'$, and a neuron 400 for receiving a signal from the common node of the drains of the sPMOS and sNMOS transistors.

Figure 5:
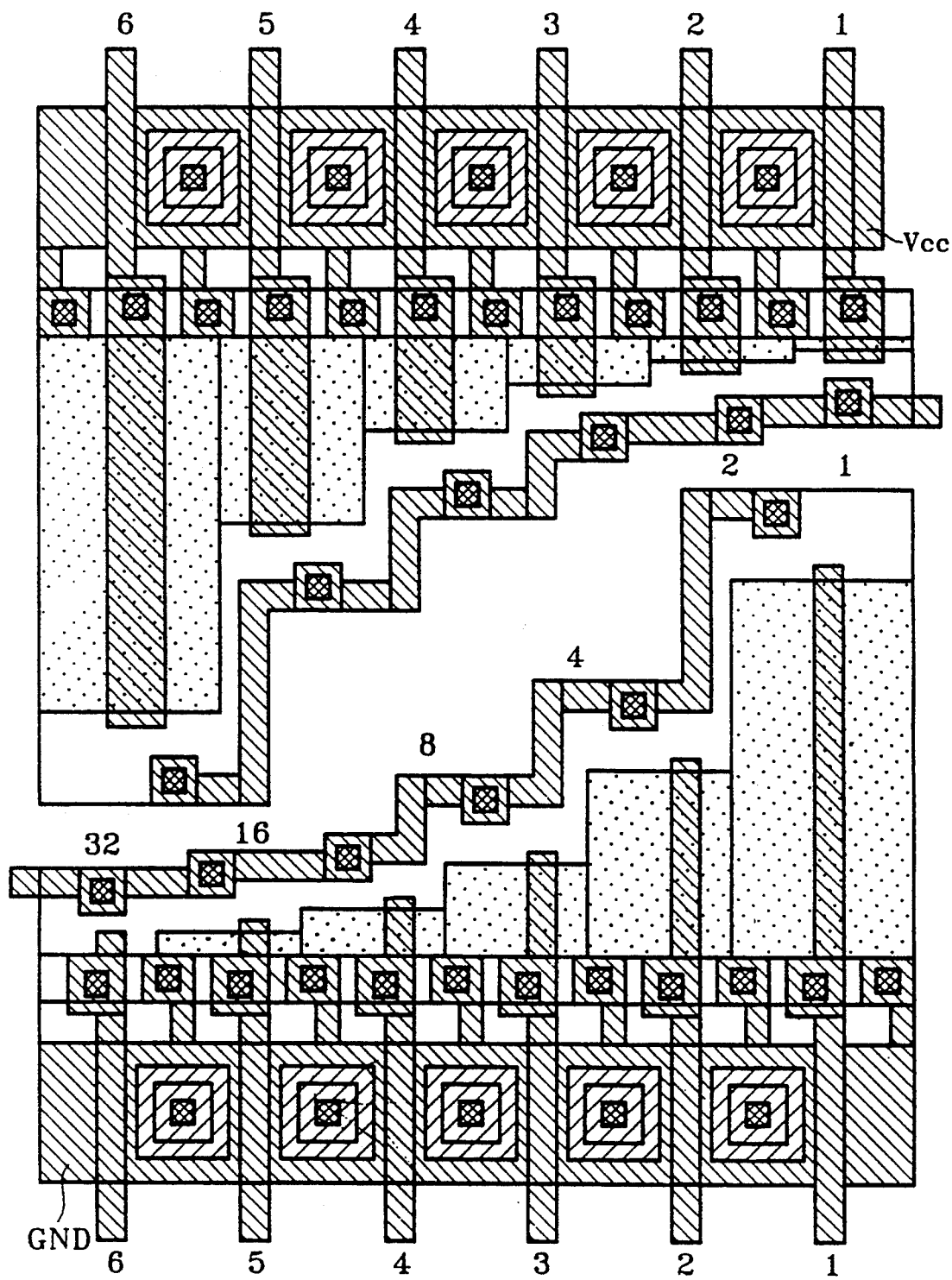
FIG. 5 illustrates a layout of the 6-bit neural comparator using a synapse MOS transistor of the present invention.

FIG. 5 shows a layout of a 6-bit neural comparator (as in FIG. 4) which uses a synapse NMOS transistor shown in FIG. 2 and a synapse PMOS transistor (not shown). In FIG. 5; considering the mobility of electrons and holes, the width of the gate electrodes of the sPMOS transistor is twice that of the sNMOS transistor.

Accordingly, when using the synapse MOS transistor of the present invention, the chip area can be reduced in device fabrication.

Further, it is noted that the present invention can be applied in the integration of all circuits, as well as in the neural network circuits.

What is claimed is:

1. A synapse MOS transistor, comprising:
    a substrate;
    a source region extending in a first direction on said substrate;
    a drain region extending in said first direction on said substrate; and
    a plurality of gate electrodes each formed directly over said substrate and each extending across said substrate from said source region to said drain region in a second direction perpendicular to said first direction;
    each of said plurality of gate electrodes having a width in said first direction different from the widths of the others of said plurality of gate electrodes, wherein said synapse MOS transistor conducts a different amount of current in response to an input signal being applied to a different one of said plurality of gate electrodes.

2. A synapse MOS transistor as claimed in claim 1, wherein the widths of said plurality of gate electrodes vary in integral proportion to each other.

3. A synapse MOS transistor as claimed in claim 1, wherein each of said plurality of gate electrodes has the same length in said second direction between said source region and said drain region.

4. A synapse MOS transistor, comprising:
    a substrate;
    a unitary source region extending in a first direction on said substrate;
    a unitary drain region extending in said first direction on said substrate; and
    a plurality of gate electrodes each formed over said substrate and each extending from said unitary source region to said unitary drain region in a second direction perpendicular to said first direction;
    each of said plurality of gate electrodes having a length in said second direction between said unitary source region and said unitary drain region different from the lengths of the others of said plurality of gate electrodes, wherein said synapse MOS transistor conducts a different amount of current in response to an input signal being applied to a different one of said plurality of gate electrodes.

5. A synapse MOS transistor as claimed in claim 4, wherein the lengths of said plurality of gate electrodes vary in integral proportion to each other.

6. A synapse MOS transistor as claimed in claim 4, wherein each of said plurality of gate electrodes has the same width in said first direction.

7. A synapse MOS transistor as claimed in claim 4, wherein said source region is formed in a staircase shape.

8. A synapse MOS transistor as claimed in claim 4, wherein said drain region is formed in a staircase shape.

* * * * *